US007003477B2

(12) United States Patent
Zarrow

(10) Patent No.: US 7,003,477 B2
(45) Date of Patent: Feb. 21, 2006

(54) CERTIFICATION METHOD FOR MANUFACTURING PROCESS

(76) Inventor: Phillip Zarrow, 12 Sunnyside Dr., Durham, NH (US) 03824

( * ) Notice: Subject to any disclaimer, the term of this patent is extended or adjusted under 35 U.S.C. 154(b) by 116 days.

(21) Appl. No.: 10/374,483

(22) Filed: Feb. 26, 2003

(65) Prior Publication Data

US 2003/0182180 A1 Sep. 25, 2003

Related U.S. Application Data

(60) Provisional application No. 60/361,181, filed on Mar. 1, 2002.

(51) Int. Cl.
*G06F 17/60* (2006.01)

(52) U.S. Cl. .............................. 705/11; 700/97; 700/108
(58) Field of Classification Search .................. 705/11, 705/1, 7; 700/95, 97, 108–10, 109, 117, 700/121
See application file for complete search history.

(56) References Cited

U.S. PATENT DOCUMENTS

| | | | | |
|---|---|---|---|---|
| 5,664,183 | A | * | 9/1997 | Cirulli et al. ........... 707/103 R |
| 5,737,581 | A | * | 4/1998 | Keane ............................ 703/6 |
| 5,836,011 | A | * | 11/1998 | Hambrick et al. ............. 705/8 |
| 6,154,753 | A | * | 11/2000 | McFarland ................... 715/508 |
| 6,445,969 | B1 | * | 9/2002 | Kenney et al. ............. 700/108 |
| 6,847,853 | B1 | * | 1/2005 | Vinciarelli et al. ........... 700/97 |
| 2002/0035495 | A1 | * | 3/2002 | Spira et al. ..................... 705/7 |
| 2002/0116084 | A1 | * | 8/2002 | Falsetti ....................... 700/109 |
| 2002/0161594 | A1 | * | 10/2002 | Bryan et al. ................... 705/1 |
| 2003/0018487 | A1 | * | 1/2003 | Young et al. ................... 705/1 |
| 2003/0225470 | A1 | * | 12/2003 | Demetriou et al. ......... 700/100 |
| 2004/0006485 | A1 | * | 1/2004 | Weed et al. .................... 705/1 |
| 2004/0019511 | A1 | * | 1/2004 | McKinney ..................... 705/8 |

FOREIGN PATENT DOCUMENTS

JP 02001348108 A * 12/2001

OTHER PUBLICATIONS

CEERIS International, Inc., www.ceeris.com, Apr. 19, 2000 [retrieved Sep. 16, 2004], pp. 1-33, retrieved from: google.com and archive.org.*
"Certification and Qualification Information for Specifications", Defense Supply Center, Jul. 1, 1998 [retrieved Sep. 16, 2004], pp. 1-21, retrieved from: google.com.*
NSF International, "Environmental Management Systems (ISO 14001) Registation Process", www.nsf-isr.org, Apr. 22, 2001 [retrieved Sep. 16, 2004], pp. 1-12, retrieved from: Google.com and archive.org.*
Registrar Accreditation Board, www.rabnet.com, Apr. 5, 2001 [retrieved Sep. 17, 2004], pp. 1-24, retrieved from: google.com and archive.org.*
"Sanmina Receives Bellcore Certification", www.sanmina-sci.com, Feb. 3, 1999 [retreived Apr. 18, 2005], 1 page, retrieved from: Google.com.*
Graff, Ludwig C., "Operations; Can't Take the Heat", Telephoney, Oct. 2, 2000 [retrieved Apr. 29, 2005], pp. 1-4, retrieved from: Dialog, file 16.*
Omnex Systems, "Building Success Worldwide", www.omnexsystems.com, Apr. 11, 2001 [retrieved Apr. 29, 2005], 31 pages, retrieved from: Google.com and archive.org.*
Webb, William D., "The UL Product Safety Audit: Inside the Process", www.ce-mag.com/archive/02/01/Webb.html, Feb. 2001 [retrieved Apr. 29, 2005], pp. 1-6, retieved from: Google.com.*
ITM Consulting, "History", www.itmconsulting.org/history.html, Jul. 22, 2002 [retrieved Apr. 29, 2005], pp. 1-2, retrieved from: Google.com and Archive.org.*
"Letters", Computing Canada, Mar. 30, 1998 [retrieved Apr. 29, 2005], vol. 24, No. 12, pp. 1-2, retrieved from: Dialog, file 275.*
CEERIS International, Inc., www.ceeris.com, Nov. 1, 2000 [retrieved May 2, 2005], pp. 34-37, retrieved from Google.com and archive.org.*
Standish, Miles, "Anatomy of QML Validation", Defense Electonics, Feb. 1995 [retrieved Oct. 24, 2005], vol. 27, No. 2, pp. 1-8, retrieved from: dialog, file 148.*
"Sanmina-SCI'c Tech Center East Certified by Key Supplier", PR Newswire, Dec. 18, 2001 [retrieved Oct. 24, 2005], pp. 1-2, retrieved from: Dialog, file 613.*
Asher, James T., et al., "COTS calls for industry standards", Electronic Engineering Times, Nov. 28, 1994 [retrieved Oct. 24, 2005], pp. 1-6, retrieved from Dialog, file 16.*

(Continued)

*Primary Examiner*—Susanna M. Diaz
*Assistant Examiner*—Beth Van Doren
(74) *Attorney, Agent, or Firm*—Mark Nowotarski

(57) ABSTRACT

An improved method for certifying that a manufacturing facility is capable of producing quality products of a particular type is disclosed. The improved method may comprise auditing the manufacturing facility against a process standard and issuing a certification to the process standard if the manufacturing facility passes the audit. This improved method is particularly suited to manufacturing facilities producing printed circuit assemblies and/or printed circuit boards.

6 Claims, No Drawings

OTHER PUBLICATIONS

LaFara, Barbara, "Testing Military ICs", EDN, Jun. 12, 1996 [retrieved Oct. 24, 2005], vol. 41, No. 12A, 6 pages, retrieved from: Dialog, file 148.*

"ISO 9000-2 Translated Into Plain English", ISO 900-2 4.9 Process Control, Praxiom Research Limited, Alberta Canada, www.connect.ab.ca/~praxiom/9000-2.htm (last viewed on Feb. 24, 2003).

Qualified Products List, Qualified Manufacturers List: General Qualification Informatiion, Defense Supply Center Columbus, OH, Sep. 1998, pp 4-14.

"Hybrid Microcircuits, General Specification for", MIL-PRF-38534E, Jan. 6, 2003, p1.

Press Release #98, "CEERIS Releases DPMO Benchmarks", CEERIS International Inc., Old Lyme CT, Apr. 14, 2000.

IPC-6018, "Microwave End Product Board Inspection and Test", IPC Association Connecting Electronics Industries, Chicago, IL, Jan. 1998, pp i,iv,v.

"SMT Process Review", http://web.archive.org/web/20010117233100/itm-smt.com/quality.html, Jan. 17, 2001.

* cited by examiner

CERTIFICATION METHOD FOR MANUFACTURING PROCESS

CROSS-REFERENCE TO RELATED APPLICATION

This application claims the benefit of the filing date of U.S. provisional application entitled, "Certification Method for Manufacturing Process", Ser. No. 60/361,181, filed Mar. 1, 2002.

TECHNICAL FIELD

This invention relates to an improved method for certifying that a manufacturing facility is capable of producing a quality, manufactured product. It more particularly relates to a method for certifying that a printed circuit board and printed circuit assembly manufacturing facility is capable of producing a quality printed circuit board assembly.

BACKGROUND

There is a long felt need in the manufacturing arts to develop a method for certifying that a given manufacturing facility is capable of producing a quality manufactured part of a particular type. One known means for certifying comprises defining a quality management standard, auditing the manufacturing facility against the standard and then issuing a "certificate of compliance" if the manufacturing facility meets every element of the standard.

An example of a quality management standard is ISO 9000. This is a standard requiring that a quality management program with specific elements be in place. An example of an element of this standard is ISO 9000-2 4.9 This element is summarized by Praxiom Research Limited of Alberta Canada to read in part, "All products (and services) are created by means of processes". (source: "ISO 9000-2 Guidelines Translated into Plain English", http://www.connect.ab.ca/~praxiom/9000-2.htm) In other words, in order to pass an ISO 9000 audit and receive a certificate of compliance, a manufacturing facility must at least produce all products and services by a predefined process. The standard does not say what the process is or how to determine if the process is suitable for the product being produced. Nor does it give an indication that a process has acceptable yields. It merely states that the process is defined. A certification to a quality management standard, therefore, does not give a third party any indication that the manufacturing facility in question is using appropriate processes for the product being produced.

An alternative method for certifying that a manufacturing facility is capable of producing a quality manufactured product comprises auditing the products produced by a manufacturing facility to a performance specification. The Defense Supply Center, Columbus (DSCC) performs such a certification. The method for attaining the certification is described in "Qualified Products List, Qualified Manufacturers List: General Qualification Information", published by DSCC, September 1998, pp 4–14. A generic test product and associated performance specification are defined for a given class of products, such as hybrid microcircuits. The performance specification for hybrid microcircuits is described in "Hybrid Microcircuits, General Specification for", MIL-PRF-38534E, 6 Jan. 2003. The manufacturing facility then produces a set of the test products. The set of test products are audited or tested against the performance specification. If the parts meet all of the requirements of the performance specification, then the manufacturing facility is issued a certification to produce parts of the general class. The DSCC also additionally requires the manufacturing facility to meet a quality management standard similar to ISO 9000.

A given class of products, however, cannot be audited against a performance specification if the diversity of the members of the class is too great, or the evolution of the members of the class is too rapid. It is not possible in this situation to define a generic test product. Printed circuit assemblies, for example, are a given class of products that are too diverse and are evolving too rapidly for there to be a generic test product. The size of printed circuit assemblies can range from less than 1 mm×1 mm to more than 500 mm×500 mm. Solder joints on printed circuit assemblies can be through-hole, surface mount, and/or area arrays such as BGA or flip-chip. There is a wide array of fluxes, solder pastes, and solder alloys used to produce printed circuit assemblies. The assemblies themselves can range from disposable electronic smart cards to multimillion-dollar mainframe motherboards. Furthermore printed circuit assemblies are evolving rapidly. Solder paste formulations, component lead configurations, component pitch, lead surface metallizations and other physical parameters of the components and assemblies themselves are changing on a yearly and sometimes monthly basis. For reasons of diversity and rapid evolution, therefore, neither the DSCC nor any other entity known to the inventor has been able to define a generic test product for printed circuit assemblies and hence have not been able to certify a manufacturing facility to produce quality printed circuit assemblies to a product standard.

SUMMARY OF INVENTION

This invention is an improved method for certifying that a first manufacturing facility is capable of producing quality products of a particular type. The method comprises the steps of inspecting at least one second manufacturing facility known to produce good parts of said particular type; preparing a manufacturing process standard based on said inspection; auditing said first manufacturing facility against said manufacturing process specification; and issuing a process certification to said first manufacturing facility if said first manufacturing facility passes the audit.

The steps of inspecting at least one second manufacturing facility known to produce good parts at acceptable yields, preparing a manufacturing process standard based on said inspection and auditing a first manufacturing facility against said standard is referred to herein as benchmarking. The results of an inspection of at least one manufacturing facility known to produce good parts is referred to herein as a benchmark. Benchmarks are periodically published for different factories producing good parts of a particular type. The company CEERIS of Old Lyme CT, for example, publishes benchmarks for printed circuit assembly facilities on a periodic basis as evidenced by the press release "CEERIS Releases DPMO Benchmarks" dated Apr. 4, 2000 and incorporated herein by reference. Benchmarks are objective standards as to what good manufacturing processes for parts of a particular type are at a given time. Benchmark studies also establish what the state-of-the art, best-of-breed or best-in-class manufacturing processes are at a given time.

Two products are of the same particular type if they share at least one similar essential characteristic requiring a similar manufacturing process. For example, if two printed circuit assemblies comprise a ball grid array (BGA), then they share the similar essential characteristic of comprising a ball grid array. This essential characteristic requires a similar manufacturing process, such as a BGA rework station and/or BGA inspection system. The two printed circuit assemblies, therefore, are of the same particular type known as "BGA assembly". This is true even if they differ substantially in other characteristics, such as size.

This invention provides the surprising benefit of providing an objective process standard for the manufacturing process for a product of a particular type despite a wide diversity or rapid evolution of the members of a given class of products to which the product belongs or rapid evolution of the equipment and processes that produce the products. The method can be applied to any manufacturing process. It is particularly suited to the processes used to manufacture printed circuit boards or printed circuit board assemblies. These processes can include surface mount soldering, wave soldering, BGA rework and the like.

The invention may also comprise an improved method for certifying that a manufacturing facility is capable of producing quality products of a particular type, said method comprising the steps of performing an audit of the manufacturing processes of said first manufacturing facility against a manufacturing process standard and issuing a process certification to said manufacturing facility if said first manufacturing facility passes the audit.

The invention may also comprise an improved product of a particular type wherein the improved product is produced by a manufacturing facility that has been certified to a process standard for products of said particular type.

The invention may also comprise an improved means of indicating to a third party that a manufacturing facility is capable of producing quality parts of a particular type which comprises the step of publicly displaying a certification of the factory wherein the certification is to a manufacturing process standard for the products of a particular type.

DETAILED DESCRIPTION

The invention is a method of assuring that a contract electronics manufacturer (CEM), Original Equipment Manufacturer (OEM), printed circuit board (PCB) fabricator or printed circuit board assembly (PCBA) assembler can manufacture a quality product. The invention is assurance to a third party that an electronics assembler's assembly process has met objective standards.

The method may comprise a client making an application to a certification entity for a process certification of its manufacturing facility. The certification entity then begins its Process Audit of the manufacturing process to be certified.

Prior to the audit, the certification entity inspects at least one second manufacturing facility known to produce good parts of the same particular type as the client. The at least one second manufacturing facility is preferably state-of-the-art at the time of the inspection. A manufacturing facility may be considered state of the art if its yields are comparable to that of the best of similar facilities that have been evaluated in a benchmark study. Yields from two different facilities may be considered comparable if they are within 50% of each other. The benchmark study was preferably performed within a year of the inspection.

The certification entity prepares a manufacturing process standard based on the inspection of the at least one second manufacturing facility. The standard comprises acceptable values for parameters describing the second manufacturing facility. These values might comprise acceptable equipment, materials, ambient temperature and humidity, line speed parameters, operator attitudes, and plant layout. The standard is preferably written down. The inspection may occur prior to the client's application for certification. The inspection preferably occurs less than a year prior to the audit. Preferably two or more second facilities are inspected. More preferably three or more second facilities are inspected.

A given part may comprise multiple particular types. A single printed circuit assembly, for example, may comprise a BGA component and a through-hole component. The assembly would therefore be of the two particular types known as "BGA assembly" and "through-hole assembly". The manufacturing process standard, therefore, would be based on the inspection of at least one facility producing good BGA assemblies and at least one facility producing good through-hole assemblies. These two facilities may be the same facility. This is preferred when there are interactions between the processes for producing parts of multiple particular types.

Once the process standard is prepared, the client's manufacturing facility is audited. Areas of the assembly process are examined in detail. The examination should include: equipment, assembly processes, materials, documentation, configuration control, incoming inspection procedures, factory control, "design for manufacturing" guidelines, workmanship standards, process control practices, defect data and corrective actions taken, as well as general operations. Personnel, including management, engineering, technicians, operators, and other line personnel may be interviewed. The certification entity may take measurements and analyze various process centers. Process centers should include all equipment used to manufacture a PCB assembly which may include the stencil printer, pick and place machines, reflow ovens, inspection stations and repair systems. Compatibility of process parameters and materials may be evaluated.

Once the audit is complete, the certification entity will either certify that the client's manufacturing processes meets the manufacturing process standard or will suggest corrective action. If corrective action is required, then different levels of recommendations may be proposed. These levels include:

Level I—recommendations that will directly and immediately impact the manufacturing process in terms of yield, efficiency or quality of the product.

Level II—recommendations that will significantly improve the process but are not as urgent.

Level III—recommendations that are directions that the client may wish to eventually pursue.

Level IV—recommendations that will improve the safety of the client's personnel.

Implementation of Level I recommendations is a requirement for Process Certification. Implementation of Level IV recommendations may also be required if the manufacturing facility is audited against an additional safety standard. The safety standard may be governmental in origin, such as OSHA (Occupational Safety and Health Administration) standards in the US. The safety standard may also be based on a benchmark to similar facilities.

Implementation of the required recommendations is preferably completed within 6 months after the initial Process Audit. They are more preferably completed within 1 month after the initial Process Audit. After a fixed period of time, the certification entity will return to the facility to re-examine the process and possibly interview people for compliance to the specified recommendations in a Follow-up Audit. The certification entity may also re-examine key areas of the process that were previously covered on the initial Process Audit to assure that they have not degraded. Key areas may include areas of the process that are known to degrade rapidly over the time interval from the initial Process Audit to the Follow-up Audit. In printed circuit board manufacture, key areas can include copper plate, photo engraving and safe practices. In printed circuit assembly, key areas can include pick-and-place machines, stencil printers and reflow ovens. If the process meets the process standard in the follow-up audit, the certification entity will grant a Process Certification.

During the course of a Process Audit, expertise in critical areas of, for example, electronic assembly may be observed and examined by the certification entity. If the certification entity finds competence in these areas, the Process Certification will carry endorsements for these areas.

The Process Certification is valid for a fixed period, such as two years, from the date of initial Certification. At that time, a new Process Audit will take place and if the manufacturing process meets the process standard then the certification will be renewed for an additional fixed period, such as two years. If the Process Audit results in Level I recommendations, these will have to be completed and approved prior to certification renewal. The Process Certification may also require that all Level IV recommendations be implemented.

The process standard may be updated prior to the new Process Audit by performing a new inspection of a facility known to produce good parts.

By attaining the certification entity's Process Certification, a manufacturer, such as a contract assembler or original equipment manufacturer (OEM), can assert that their manufacturing process has met objective standards. Having the areas of improvement pointed out by the certification entity and implementing them improves the manufacturing process.

EXAMPLE 1

The certification entity proposes to review Company A's surface mount technology (SMT) operation for the purpose of benchmarking and recommending improvements/enhancements to the operation that might result in higher yields and more efficient through-put. The certification entity shall perform a comprehensive Process Audit of Company A's surface mount technology (SMT) assembly process. Services performed shall include:

The certification entity will tour Company A's production facility.

The certification entity will meet with key personnel of Company A to determine perceived process strengths and weaknesses and related concerns.

The certification entity will review the process documentation and yield data of Company A including:
Design procedures, design, and design for manufacturing (DFM) guidelines
Defect analysis data The certification entity will perform an assessment of the SMT assembly and soldering processes including procedures, equipment, production methods, production rates, configuration control and process controls.

The certification entity will work with responsible personnel of Company A to diagnose problems observed by Company A and/or the certification entity.

Coinciding with the above activities, the certification entity will perform a skill assessment through dialog with and observation of Company A's personnel.

The certification entity will meet with the management (and appropriate engineering personnel as designated by management) to discuss findings and recommendations for process improvement including process enhancement, controls, procedures and personnel training. Comparative analysis to state-of-the-art SMT operations of similar volume and PCBA mix shall ensue. The recommendations may include Level I recommendations.

An optional written report can be prepared and submitted summarizing the findings and recommendations resulting from the Process Audit. Specific recommendations will be made concurrent with the direction concluded by the certification entity and Company A.

The certification entity will supply most of the tools and equipment required for the process audit including temperature and humidity measurement equipment, oven profile data recorder, checklists, etc. Company A will, ideally, have its SMT line and secondary operations such as inspection, repair and thermal test running and available for assessment and documentation accessible.

In addition to the initial (proposed) Process Audit, Company A can apply for Process Certification. The certification entity shall revisit Company A at a future agreed upon date (within 8 months of the initial audit) for a follow-up audit. If all Level I recommendations cited in the initial audit have been implemented and nothing else has degraded, the certification entity shall certify Company A's SMT assembly process.

This certification states to present and prospective Company A clients that the processes, materials, equipment and personnel at Company A have been certified by the certification entity to be capable of producing quality printed circuit board (PCB) assemblies. The certification entity will be available to state and discuss this with Company A's clients. Certification is valid for 1.5 years and renewal can be applied for with a follow-on Process Audit.

The initial Process Audit is estimated to take approximately 1 on-site day and one office day to prepare the report. The certification entity can also be available for an additional day to discuss prospective process and equipment endeavors of Company A as well as any other issues relating to Company A's SMT business.

EXAMPLE 2

The certification entity will review Company B's SMT assembly process and recommend specific direction for process performance improvement. The certification entity's comprehensive process review will result in improved SMT assembly techniques and methodologies.

The certification entity will concentrate on improving company B's assembly process as well as troubleshooting specific problems Company B may be experiencing. The entire review can usually be accomplished within 2–4 days (depending upon the number of lines in the facility) and with minimal disruption to factory personnel and routines. The certification entity's specific knowledge of and experience with most major manufacturers of production equipment and solder pastes gained through its ongoing work in the field assures Company B of accurate and timely information and recommendations.

Prior to the certification entity's scheduled process review, specific information about company B's assembly process, personnel and facility will be queried including information regarding current process flow, equipment and materials being used, composition and characteristics of the product being used, current defect levels and specific trouble areas currently recognized. This allows preparation that facilitates efficient and expeditious on-site work.

The process review begins with a meeting with appropriate engineering and production staff including manufacturing, process, quality, design, and management. Each participant presents their specific areas of responsibilities as well as process concerns and problems they may have.

The certification entity personnel then proceed to make the initial examination of the assembly line(s). Procedures, equipment and materials are observed. This procedure provides additional insight for the certification entity personnel for an interview phase. Quality documentation is also reviewed at this point.

Participants involved in the initial meeting meet with the certification entity's personnel individually to further discuss their areas of responsibilities. At this juncture, initial observations and problems identified by the certification entity are mentioned and/or discussed in detail. Documentation and process control practices pertaining to the individual's area will also be reviewed.

Specific areas of the assembly process are examined in detail. At this point, the certification entity may make measurements and analysis at the various process centers including the printer, pick-and-place, reflow, inspection and repair systems. Compatibility of process parameters and materials will be scrutinized. Interviews with line personnel, as deemed appropriate, will also commence.

Upon completion of the process review, the certification entity will review its findings and compile a presentation for the Process Review Summation Meeting.

On the morning following the completion of the process review, the certification entity will present its findings in the process review summation meeting with appropriate personnel. It is here that the recommendations for process improvement will be submitted. These will include specific actions to resolve specific problems as well as issues and directions for improvement of quality and cycle time reduction. They may include Level I recommendations.

Within 1–2 weeks following the process review, the certification entity will submit a written report summarizing the findings and recommendations presented in the process review summation meeting. If desired, a follow-on meeting with corporate management to present the certification entity's findings can also be opted for.

In addition to the initial process review, the client can apply for the certification entity's process certification. The certification entity shall revisit the client's facility at a future agreed upon date (within 8 months of the initial audit) for a follow-up audit. If all Level I recommendations cited in the initial process review have been implemented and nothing else has degraded, the certification entity shall certify the client's SMT assembly process. This certification states to present and prospective customers of the client that the processes, materials, equipment and personnel have been certified by the certification entity to be capable of producing quality PCB assemblies. The certification entity will be available to state and discuss this with said customers. Certification is valid for 1.5 years and renewal can be applied for with a follow-on process audit.

EXAMPLE 3

The certification entity proposes to perform an initial Process Audit at Company C's contract assembly operation for the purpose of benchmarking and recommending improvements/enhancements to the operation that might result in higher yields and more efficient through-put. The certification entity shall perform a comprehensive Process Audit of Company C's SMT and through-hole assembly process.

In the course of the Process Audit, Company C shall also apply for the certification entity's Process Certification. The certification entity's Process Certification is assurance to present and prospective customers of Company C that the processes, materials, equipment and personnel have been certified by the certification entity to be capable of producing quality PCB assemblies. Upon attaining the certification entity's Process Certification, customers and potential customers can communicate with the certification entity to discuss and confirm Company C's capabilities. Company C will also be attempting to qualify for No-Clean and BGA Endorsements. No-Clean refers to Company C's processes, equipment and materials that are used to produce circuit board assemblies that do not require cleaning.

Services performed shall include:
The certification entity will tour Company C's production facility.
The certification entity will meet with key personnel to review process strengths and weaknesses, defect and process related problems and other pertinent concerns.
The certification entity will review process documentation and yield data including:
Design procedures, design and DFM Guidelines
Defect analysis data
Workmanship standards
The certification entity will perform an assessment of the assembly and soldering processes including procedures, materials, equipment, materials qualification testing, production methods, production rates, and process controls.
The certification entity will work with responsible personnel of Company C to diagnose problems observed by Company C and/or the certification entity.
Coinciding with the above activities, skill assessment will be undertaken through dialog with and observation of Company C personnel.
The certification entity will meet with the Management (and appropriate engineering personnel as designated by Management) in a summary meeting to discuss findings and recommendations for process improvement including process enhancement, controls, procedures and personnel training.
A written report will be prepared and submitted summarizing the findings and recommendations resulting from the Process Audit. Specific recommendations will be made.
Level I—recommendations that will directly and immediately impact the manufacturing process in terms of yield, efficiency or quality of the product.
Level II—recommendations that will significantly improve the process but are not as urgent.
Level III—recommendations that are directions that the client may wish to eventually pursue.

Fulfillment of Level I recommendations, as disclosed in a follow-up Process Audit (to be conducted within 6 months of the initial Process Audit) will result in Company C's qualifying and attaining the certification entity's Process Certification.

The certification entity will supply most of the tools and equipment required for the process audit including temperature and humidity measurement equipment, checklists, etc. Company C should provide a profile data recorder and have its defect data and related statistical process control (SPC)

data available for examination. Company C will have its PCB assembly and secondary operations running and available for assessment and documentation accessible.

The Process Audit is estimated to take approximately 2 (cumulative) on-site days.

The Process Audit report is estimated to take approximately 1 office (off-site) day to prepare.

The Follow-Up Process Audit, if required, is estimated to take approximately 1 on-site day.

EXAMPLE 4

The certification entity Process Certification is assurance to present and prospective customers of the Certified Contract Electronics Manufacturer (CEM) that the processes, materials, equipment and personnel have been certified by the certification entity to be capable of producing quality PCB assemblies.

The Process Certification procedure begins with a thorough Process Audit by the certification entity's team of experienced and qualified Process Examiners.

All areas of the assembly process are examined in detail. The examination includes: all equipment, assembly processes, materials, documentation, configuration control, incoming inspection procedures, factory control, DFM guidelines, workmanship standards, process control practices, defect data and corrective actions taken, as well as general operations. Personnel at all levels—management, engineering, technicians, operators, and other line personnel are randomly interviewed. The certification entity will take measurements and analyze various process centers including the stencil printer, pick-and-place, reflow, inspection and repair systems. Compatibility of process parameters and materials will be scrutinized.

Once the audit is complete, the certification entity will either certify that the CEM's assembly processes meet the certification criteria or will suggest corrective action. If corrective action is required, three levels of recommendations will be proposed.

Level I—recommendations that will directly and immediately impact the manufacturing process in terms of yield, efficiency or quality of the product.

Level II—recommendations that will significantly improve the process but are not as urgent.

Level III—recommendations that are directions that the client may wish to eventually pursue.

Implementation of Level I recommendations is a requirement for the certification entity's Process Certification. These must be completed within 6 months after the initial Process Audit. At that time, the certification entity will return to the facility to re-examine the process for compliance to the specified recommendations. The certification entity will also re-examine key areas of the process (that were previously covered on the initial Process Audit) to assure that nothing has degraded. If the process is up to standards, the certification entity will grant Process Certification.

The certification entity Process Certification is valid for two years from the date of initial Certification. At that time, a new Process Audit will take place and, assuming all is up to the certification entity's level of standards, certification will be renewed for another two years. If the Process Audit results in Level I recommendations, these will have to be completed and approved prior to Certification renewal.

During the course of the Process Audit, expertise in critical areas of electronic assembly may be observed and examined by the certification entity. If the certification entity finds competence in these areas, the Process Certification will carry endorsements for these areas. Such Process Endorsements include capability in No-Clean Soldering, Ball Grid Array (BGA), Chip Scale Packages (CSP) and Flip-Chip, Lead-free Soldering, and others.

The certification entity Process Certification demonstrates to prospective and existing clients that the proper equipment, processes, training, materials and attitudes are in place to competently build their product. The certified company's clients can call the certification entity to discuss their findings and confidence in the certified company's capabilities. While the certification entity cannot guarantee perfect product assembly, they will stand by their findings that everything required to produce a quality product is in place from a capability and control standpoint.

Many OEMs do not know how nor have the manpower to perform source inspection or certification of a CEM—particularly as it relates to their mix and volume. The certification entity has this expertise and can confidently recommend Certified clients to the OEM and qualify that recommendation. OEMs will be assured that a CEM with the certification entity Process Certification has been thoroughly examined and approved to very high objective standards.

EXAMPLE 5

Company E manufactures microwave PCB assemblies. The microwave PCB assemblies produced by Company E belong to both of the particular type called "microwave end-product circuit boards" and of the particular type "SMT assemblies". Microwave end-product circuit boards are a given class of products that have a specific performance specifications. The performance specification is IPC-6108, "Microwave End Product Board Inspection and Test", which is published by the IPC, Chicago Ill. and is incorporated herein by reference. SMT assemblies are a given class of products that do not have a performance specification to the best of the knowledge of the inventor. Company E was located in the state of NY in USA where it must meet the safety standards of NY OSHA (Occupational Safety and Health Administration).

Company E hired a certification entity to provide certification that the manufacturing facility and products produced conformed to said IPC performance specification, a process standard for microwave end-product circuit boards, a process standard for SMT assemblies, the safety standards of NY OSHA and a benchmark safety standard for other manufacturers of circuit boards and printed circuit board assemblies. The process standards of each particular type were based on a benchmark to a state-of-the-art facility producing the same particular types. One state-of-the-art facility was inspected to produce the standard for microwave end product circuit board manufacturing. This standard is referred to herein as MEP. Three state-of-the-art facilities were inspected within one year prior to the audit to produce the process standard for SMT assemblies manufacturing. This standard is referred to herein as SMTP. The benchmark safety standard was based on said inspections as well. It is referred to herein as STYP.

Company E's manufacturing facility was audited by the certification entity. The relevant portion of the results are presented in Table 1. The first column states the item of the manufacturing process that was audited. Bold items in the first column are general headings for subsequent items. The second column states what level a recommendation is. Level I, Level II, Level III and Level IV (i.e. safety) levels are noted. A blank cell in the second column means that an item met the particular element of the standards or specifications appropriate for that item. The third column states a recommendation if an item failed to meet an element of the standards or specifications. The third column also contains comments that the auditor felt would be of interest to Company E. A blank cell in the third column means that no observation was made that was worth bring to the attention of Company E. The fourth column states an element of either the specification or standards that the item was audited against. Cells in the fourth column that are blank refer to items for which there was no specification or standard worth noting. In order to pass the audit and receive certification, all Level I and Level IV recommendations had to be implemented.

TABLE 1

| Audit Checklist | Recommendation Level | Recommendation/ Comments | |
|---|---|---|---|
| | | | Process Standards |
| | | | MEP, Benchmark Microwave End Product Manufacturing Process SMTP, Benchmark, SMT Assembly Manufacturing Process. Product Specifications |
| | | | IPC-6018A, Microwave End-Product Board Inspection and Test Safety Standards |
| | | | NY OSHA STYP, Benchmark for Microwave End Product and SMT audited facilities |
| Client employees interviewed | | | |
| Inspection and Manufacturing Personnel | | | MEP, SMTP, personnel know and follow manufacturing processes. |
| Quality Systems Engineer | | | MEP, SMTP, personnel know and follow quality processes. |
| Manufacturing Process Engineer, Project Engineer | | | MEP, SMTP, personnel know manufacturing processes. |
| Manufacturing and Engineering Managers | | | MEP, SMTP, personnel know manufacturing processes. |
| Special Problems/Challenges: | | | |
| | | Note: these items summarize the meeting with Company E's personnel | |
| | | Cross divisional communication between personnel | MEP, SMTP, There is cross divisional communication between personnel. |
| | Level III | Measuring Cu thickness per IPC-6018A, 3.6.3.1. How you do you verify 20% of 1/4/ oz Cu? | IPC-6018A, 3.6.3.1 |
| | Level III | Concern about the detail and conformance criteria for Class 3 | IPC-6018A, Class 3 requires a great deal of configuration control (traceability), and an increase in inspection and testing. See paragraphs IPC-6018A-1.3, 3.4, 3.5, 3.6, 3.7, 3.8, 3.10, 3.11, 3.12 |
| | Level III | Is equipment necessary for Class 3 qualification | MEP, SMTP, No equipment requirements other than that for testing. |
| Board Class: | | | |
| | | Class 2 and 3 product both processed on the production floor | |
| Procurement-Documentation | | | IPC-6018A-1.3.3, 1.4 |
| Title, number, date of spec listed on doc | | OK | MEP, SMTP, Title, number, date of spec listed on doc |
| Exceptions noted (if any) | | OK | MEP, SMTP, exceptions are noted |
| Title, number, date of master dwg listed | | copy of master drawing is forwarded to sub contractor, rev verified | IPC-6018A-1.4 |
| Part ID and marking listed on doc | | OK | MEP, SMTP Part ID and marking listed on doc |

TABLE 1-continued

| Audit Checklist | Recommendation Level | Recommendation/ Comments |  |
|---|---|---|---|
| Delivery info (if necessary) | | OK | |
| Acceptance level classifications listed | | OK | MEP, SMTP, Acceptance level classifications listed |
| Inspection requirements listed | | inspection requirements are listed on master drawing | IPC-6018A-1.4 |
| Document approved by manager | | OK | MEP, SMTP, Document approved by manager |
| General Observations: | | Well organized and maintained procurement operations. Procurement specialist well trained and obviously knows the job requirements | MEP, SMTP, Procurement operations are well organized and maintained. Procurement specialist are trained and know job requirements |
| Pre-production Engineering | | | |
| Documentation Review | | Spec sheet and drawing supplied by customer or created by Company E's design dept. All materials reviewed by project engineer prior to release | MEP, SMTP, All materials reviewed by project engineer prior to release. |
| Work Instructions Available | | Determined by engineering program software. Project engineer reviews job, determines process path and schedules: PDR (pre-design review) with customer Design review Critical design review | MEP, SMTP, Work instructions determined by engineering program software. Project engineer reviews job, determines process path and schedules. MEP, SMTP, Design reviewed with customer before finalization |
| | | Manufacturing readiness review by customer | MEP, SMTP, Review manufacturing readiness with customer. |
| | | Models (1st piece) built. This entire process is among the best I've seen. Other facilities audited in the past do not take the time and the attention to detail. | MEP, SMTP, First piece built and evaluated in detail. |
| Traveler Review | | | |
| contents | | Company designs and travelers are created in-house. Each is checked against the project checklist and master drawing. | MEP, SMTP, Travelers checked against project checklist. |
| method of configuration | Level III | Drawings and engineering information are kept in file cabinets (org. by part number) in each inspection area. Concerned about configuration control of the several copies of drawings kept on the floor. | Note: This is not a violation of 6018A, just a concern. However, the process traveler requires the operator/inspector to verify the configuration level of the document at each process step. |
| work instructions | | For pre-production, work instructions are viewed through the engineering program software. This is an excellent method of tracking the engineering steps and to interface with the customer. | MEP, SMTP, Engineering steps are tracked and interfaced with customer. |
| special notations | | Made per customer or engineering request. All notations are kept in the engineering software program for future reference. | MEP, SMTP, Notations are recorded for future reference. |
| class noted | | Yes, in a special field created on the traveler. Easy recognition by the operator is possible due to the color coded bags used for each traveler - i.e., Red for Class 3. | MEP, SMTP, Class is noted. |

TABLE 1-continued

| Audit Checklist | Recommendation Level | Recommendation/ Comments | |
|---|---|---|---|
| spec noted | | OK | MEP, SMTP, Spec is noted. |
| std listed | | OK | MEP, SMTP, Standard is listed |
| sign-off | | N/A | |
| Process Documentation | | | IPC-6018A |
| document review | | Once the project has been reviewed by the project engineer, the document is forwarded for an additional review by all participating departments. | MEP, SMTP, Process documentation is reviewed by project engineer and participating departments. |
| dimensional check | | 1st piece is released, built and measurements made | MEP, SMTP, First piece is released, built and tested. |
| noted on traveler | | OK | MEP, SMTP, notation of dimensional check made on traveler. |
| materials review | | NA at this point | |
| how listed | | noted per spec, per order | |
| noted on traveler | | OK | |
| CoC (Certificate of conformance) Available | | OK | MEP, SMTP, CoC is available. |
| tools noted | | Yes - drill bits, etc. called out and noted on drawing | MEP, SMTP, Tools are noted on drawing |
| problems noted? | | OK | MEP, SMTP, Problems are noted |
| method of feedback | | Weekly meetings with customer. | MEP, SMTP, Customer feedback provided for. |
| segregation of class/rejected products - how? | | Job placed in MRB area after NCMR is written. Engineer notified. | MEP, SMTP, parts segregated according to class. Rejected parts are segregated. |
| Configuration Control Method | | | IPC-6018A |
| Test coupon | | Programmed and located per job. Class 3 coupons have been designed and are included on artwork and drill programs. | |
| Housekeeping | | OK | MEP, SMTP all items are in proper storage or in use. No trash or discarded items on floor. |
| Film and tool review | | At the time of pre-traveler release. | |
| tooling process (film) | | Multiline tooling punch | |
| dimensional inspection | | At Copper Plate (CP) | MEP, SMTP, dimensions are checked by calibrated instruments. |
| visual inspection for defects | | | |
| where | | At CP | |
| how marked/controlled | | Defects (scratches, pinholes, etc). are marked with tape arrow by inspection personnel. Engineering decides if tool is usable. | MEP, SMTP, defects are marked. |
| usage noted | Level I | No. Film should have date of plot, and usage should be tracked similar to tracking system used on # of drill hits. Part of configuration control. Film ages and is sensitive to temperature, humidity and handling. Polyester-type materials do not exhibit historisis (material memory - allowing material to return to pre-exposure condition) and therefore must stored and used in controlled conditions. | MEP, SMTP, Film must have date of plot. Usage must be tracked similar to tracking system used on # of drill hits. |
| how stored | | In photo department | |
| temp & humidity | | 69 F./40% | MEP, SMTP, As part of configuration control, temp/RH must be maintained as consistent between process operations - photo-plot, image processing, lamination, laminate storage |
| Housekeeping | Level I | Walk off mat not changed and not sticky. Dust will affect the quality of | MEP, SMTP, Walk off mat needs to be checked regularly and replaced when no longer "sticky." |

TABLE 1-continued

| Audit Checklist | Recommendation Level | Recommendation/Comments | |
|---|---|---|---|
| | Level I | photo tools, lamination and performance of microwave assemblies. Temp/Humidity recorder chart held record paper that hadn't been changed in several weeks. (Undetermined length of time) Temp/humidity requirements specified in materials and operations specifications. | MEP, SMTP, As part of configuration control, temp/RH must be maintained as consistent between process operations - photo-plot, image processing, lamination, laminate storage |
| Materials Storage | | | |
| Work Instructions Available | Level I | Instructions were located high on wall above the windows. They were out of reach, out of eyeshot and difficult to reach (no step stool or ladder present). | MEP, SMTP, Instructions should be located within easy reach and line of sight of the operator. |
| Std/Spec Available | | OK | MEP, SMTP, standard and spec available. |
| Housekeeping | Level II | In general - OK. However, care must be taken when storing laminate to assure that edges and corners do not overhang the edge of the shelving. Current conditions constitute a safety hazard. | MEP, SMTP all items are in proper storage or in use. No trash or discarded items on floor. |
| Incoming Materials Control - Lam. | | | |
| CoC | | On file | MEP, SMTP, CoC is on file. |
| Receiving | | Laminate verified for vendor, lot number and qty received, CoC forwarded to incoming inspection for filing | MEP, SMTP, Received items verified for vendor, number and qty received. |
| Lot verification | | Match lot number on CoC to Packing Slip | MEP, SMTP, Lot number matched to packing slip. |
| Testing/Verification | Level II | None, no referee measurements made. Suggest periodic verification on materials received - copper thickness, laminate thickness and occasional glass verification to spec. Referee measurements keep vendors honest. It's a simple test used to verify quality of incoming materials. | |
| Incoming Materials Control - preg | | | |
| CoC | | On file | MEP, SMTP, CoC is on file. |
| Receiving | | Preg verified for vendor, lot number and qty received, CoC forwarded to incoming inspection for filing | MEP, SMTP, Received items verified for vendor, number and qty received. |
| Lot verification | | Match lot number on CoC to Packing Slip | MEP SMTP, match lot number on Packing slip. |
| Testing/Verification | Level II | None, no referee measurements made. Suggest periodic verification on materials received - copper thickness, laminate thickness and occasional glass verification to spec. | |
| Storage and control | | | |
| Laminate Temp/Humidity | Level I | See Housekeeping remarks None present | MEP, SMTP, As part of configuration control, temp/RH must be maintained as consistent between process operations - photo-plot, image processing, lamination, laminate storage |

TABLE 1-continued

| Audit Checklist | Recommendation Level | Recommendation/ Comments | |
|---|---|---|---|
| Pre-preg | | | |
| Temp/Humidity | | No calibration of refrigerated storage | |
| Shelf Life noted | | OK | |
| Housekeeping | Level I | Walkoff mat needs regular/daily change. Suggest adding a W/O rug in addition to sticky mat. | MEP, SMTP, Walk off mat needs to be checked regularly and replaced when no longer "sticky." |
| RMR Area | | See Inspection Audit | |
| Locked | | | |
| Segregated by Matl | | Lot | |
| Production | | | |
| CoC copy available | | On File | MEP, SMTP, CoC is on file. |
| Who controls | | Print Crib | |
| Housekeeping | | Good | MEP, SMTP all items are in proper storage or in use. No trash or discarded items on floor. |
| Incoming Matls Control-chem | | | |
| CoC | | None available | |
| Receiving | | Verification of received materials against Packing List | |
| Lot verification | | See above | |
| Testing/Verification per | | None. | |
| Storage and Control | | | |
| Segregated per OSHA (NY-OSHA) | Level IV | No segregation of materials per OSHA (NY-OSHA) regulations. Acids and Caustics were randomly placed in CP (plating area), not organized According to safe practices as specified by OSHA (NY-OSHA) regs. | NY OSHA |
| Marked | | | |
| container | | OK | NY OSHA |
| storage area | | Yes. All containers were placed in hazard liners (a good practice especially when containers are not segregated by acid/base) | NY OSHA |
| Testing/Verification per | | None | |
| Housekeeping | | See CP | |
| LiFo/FiFo | | FiFo | |
| Instruments | | OK | |
| Calibration | | | |
| method | | N/A | |
| verified | | N/A | |
| Equipment Maint Log | | On file | STYP, maintenance log is kept on file. |
| PM (Preventative Maintenace) | | | |
| Safety Practices | | | |
| MSDS (Material Safety Data Sheets) Available | Level IV | All safety data sheets are located in print crib and not in the area where they are needed. Strongly suggest that MSDS' be located in the production areas where they are needed. | STYP, MSDS need to be located in each section, especially where chemicals are stored and used. MSDS gives instructions on exposure treatment, spill containment, etc. |
| Handling | | With gloves | STYP, MEP, materials to be handled with appropriate personal protective equipment. |
| Misc matls Control | | N/A | |
| Order Release | | | |

TABLE 1-continued

| Audit Checklist | Recommendation Level | Recommendation/ Comments | |
|---|---|---|---|
| Traveler Updated | | OK | MEP, SMTP, travelers are updated. |
| Materials Prep | | | |
| Work Instructions Available | | Yes, see notes under Work Instructions, Materials Store | MEP, SMTP, work instructions are available. |
| Equipment Maint Log | | Shear Filed in maint. Dept. | MEP, SMTP, maintenance log is on file. |
| Safety Practices | | | |
| MSDS (Material Safety Data Sheet) Available | Level IV | No, see above | STYP, MSDS need to be located in each section |
| Handling | | OK | |
| Matl Pull | | | |
| CoC verified | | OK | |
| noted | Level III | Yes. Company's system of control is solid. However, you may be gigged on the lack of referee testing | |
| Matl. Prep per | | Traveler | |
| Housekeeping | | See notes under Housekeeping, Materials Store | |
| Order Release | | | |
| Traveler updated | | OK | MEP, SMTP, travelers are updated. |
| Drill | | | |
| Work Instructions Available | | Yes. Location, attached to shelving between the drills and router easily accessible to operators. | MEP, SMTP, work instructions are available for all equipment. |
| Equipment Maint Log | | Filed in Maint. Dept | MEP, SMTP, maintenance log is on file. |
| PM | | | |
| Safety Practices | | | |
| MSDS Available | Level IV | In Print Crib | STYP, MSDS need to be located in each section |
| Handling | | OK | |
| Configuration control | | Good crosscheck of N/C tape or program to drill callout and inspection | |
| Matl. Prep per | | Good Dwg/traveler | |
| Tooling check | | Per operator sheet located at each drill station - GOOD checklist | MEP, SMTP, tooling is checked per checklist |
| Set up | | Checked against instructions | MEP, SMTP, tooling set up is checked against instructions. |
| Operation | | | |
| Test pnl | | OK | |
| Offset method | | Use of Multiline or normal jobs, checked by x-ray on more difficult multilayers. | |
| Post drill check | | | |
| Hole size | | Not observed | |
| Location check | Level III | Good use of drill inspection aid. Aids have part number and rev noted. Suggest that each inspection aid be marked with part no. and rev in a consistent place (markings are randomly placed on aid). | |
| Tools | | | |
| Bit Storage | | Good | MEP, bits are stored properly |
| Use control | | By # of hits | MEP, use of bits is controlled. |
| Re-point | | No | |
| Housekeeping | | Good | MEP, SMTP all items are in proper storage or in use. No trash or discarded items on floor. |
| | Level I | Temperature and humidity recorded chart not updated. Chart needs to be changed | MEP, SMTP, As part of configuration control, temp/RH must be maintained as consistent |

TABLE 1-continued

| Audit Checklist | Recommendation Level | Recommendation/ Comments | |
|---|---|---|---|
| | | weekly. Temperature & RH = 73.3 F./47.4 RH (referee check, in spec) | between process operations- photo-plot, image processing, lamination, laminate storage |
| Order Release | | | |
| Traveler updated | | Yes - miscellaneous rework is noted on the traveler. | MEP, SMTP, traveler is updated. |
| | Level I | One job was passed to the next operation without signoff of a process not performed. Upon questioning, was told that the step was not necessary for this job. Suggest signoff or lining through and initialing unnecessary operations. | MEP, SMTP, traveler is updated. |
| Deburr | | | |
| Work Instructions Available | | OK | MEP, SMTP, World instructions are available. |
| Equipment Maint Log | | In Maint. Dept | MEP, SMTP, maintenance log is on file |
| PM Safety Practices | | | |
| MSDS Available | Level IV | See above | STYP, MSDS need to be located in each section, especially where chemicals are stored and used. MSDS gives instructions on exposure treatment, spill containment, etc. |
| Wet Process - CP | | | |
| Work Instructions Available | | OK | MEP, SMTP, Work instructions are available. |
| Equipment Maint Log | | See above | MEP, SMTP, maintenance log is on file |
| PM Safety Practices | Level IV | Drum storage blocks eyewash and shower in etch and debur. Violation of OSHA (NY-OSHA) req. No evidence of regular testing of eyewash or shower - OSHA (NY-OSHA) Req. | NY OSHA |
| MSDS Available | Level IV | See above | STYP, MSDS need to be located in each section, especially where chemicals are stored and used. MSDS gives instructions on exposure treatment, spill containment, etc. |
| Chem testing Frequency | Level II | On required items. Chem titration setup in exhibited dried crystalline (2 tubes) structures on titration tube. If these crystals fall into beaker during test - results will be compromised. Suggest regular cleaning with D.I. water to assure good results. | |
| Cleanliness - wet operations | | | |
| Housekeeping | Level I | Very Poor - see notes on housekeeping | MEP, SMTP all items are in proper storage or in use. No trash or discarded items on floor. |
| Racks | | OK | |
| Anode/cathode | Level I | All cathodes showed regular cleaning. However, there does not appear to regular checks or replacement of anodes as evidenced by the poor condition of recently removed lead anodes. Evidence of this should be apparent through | MEP, SMTP Anodes and cathodes re cleaned and checked regularly. |

TABLE 1-continued

| Audit Checklist | Recommendation Level | Recommendation/ Comments | |
|---|---|---|---|
| | Level II | microsection (IPC-6018A-3.7) evaluation. There must be a regular schedule initiated with verification of checks and replacement logged. | MEP,SMTP Anodes and cathodes re cleaned and checked regularly. |
| Tanks | Level II | Acceptable. Suggest regular wiping (daily) of tank faces and tops. | MEP, SMTP Tanks are cleaned and checked regularly. |
| Thickness check | | | |
| Cu | | By operator | MEP, SMTP, all required thickness checks are performed. |
| PbSn | | CoC available from outside testing lab. | MEP, SMTP, all required thickness checks are performed. |
| Sn | | CoC available from outside testing lab. | MEP, SMTP, all required thickness checks are performed. |
| Other | | Ni/Au thickness noted by the operator on all jobs requiring. | MEP, SMTP, all required thickness checks are performed. |
| Calibration | | | MEP, SMTP, All measuring equipment is within calibration |
| Rectification | | Within Calibration | |
| Other | | | |
| Housekeeping | Level I | 1. Poor in etch. OK in plate. | MEP, SMTP all items are in proper storage or in use. No trash or discarded items on floor. |
| | Level I | 2. Drums randomly placed in area. No segregation by type. | MEP, SMTP all items are in proper storage or in use. No trash or discarded items on floor. |
| | Level I | 3. Drums block access to equipment and work tables | MEP, SMTP all items are in proper storage or in use. No trash or discarded items on floor. |
| | Level I | 4. Old Somaca deburrer stored in area. | MEP, SMTP all items are in proper storage or in use. No trash or discarded items on floor. |
| Traveler Updated | | OK | MEP, SMTP, all travelers are updated. |
| Micro Etch - CP | | | |
| Work Instructions Available | | OK | MEP, SMTP, all work instructions are visible |
| Equipment Maintenance Log | | See above | MEP, SMTP, all maintenance logs are available |
| PM | | | MEP, SMTP, PM is done according to plan |
| Safety Practices | Level IV | Electrical panels blocked, DI cylinder not strapped to wall per OSHA (NY-OSHA) req. | NY OSHA |
| MSDS Available | Level IV | See above | STYP, all MSDSs are available |
| Chem testing | | | |
| Frequency | Level II | On required items. Chem titration setup in microetch exhibited dried crystalline structures on titration tube. If these crystals fall into beaker during test - results will be compromised. Suggest regular cleaning with D.I. water to assure good results. | |
| | Level II | No analysis log. Results not noted or tracked. | |
| Cleanliness | Level I | Poor. Etcher was covered with died etchant, floor needed cleaning | MEP, SMTP all items are in proper storage or in use. No trash or discarded items on floor. |
| Etch setup | | OK | |
| Etch control | | OK. See note concerning chem testing. | |
| Housekeeping | Level I | 1. In general - very poor. | MEP, SMTP all items are in proper storage or in use. No trash or discarded items on floor. |
| | Level I | 2. All electrical panels blocked by tables, equipment or carts | MEP, SMTP all items are in proper storage or in use. No trash or discarded items on floor. |

TABLE 1-continued

| Audit Checklist | Recommendation Level | Recommendation/ Comments | |
|---|---|---|---|
| | Level I | 3. Misc. waste materials stored In MRB area. | MEP, SMTP all items are in proper storage or in use. No trash or discarded items on floor. |
| | Level 1 | 4. DI cylinder (tank) stored at end of etcher, not strapped per OSHA (NY-OSHA) req. | MEP, SMTP all items are in proper storage or in use. No trash or discarded items on floor. |
| | Level I | 5. Jobs stacked on chem drums stored in area (not in rack) | MEP, SMTP all items are in proper storage or in use. No trash or discarded items on floor. |
| Traveler Update | | OK | MEP, SMTP, travelers are updated |
| Photo | | | |
| Work Instructions Available | | OK | MEP, SMTP, all work instructions are available |
| Equipment Maint Log | | See above | MEP, SMTP, maintenance log is available |
| PM | | | MEP, SMTP, PM is done according to plan |
| MSDS Available | Level I | See above | STYP, MSDS need to be located in each section, especially where chemicals are stored and used. MSDS gives instructions on exposure treatment, spill containment, etc. |
| Photo Tool | | | |
| Control Use control | | Controlled by operator Print operator responsible for artwork quality | |
| Setup Test Sample | | Multiline tooling used 1st article inspection on each new order | |
| Develop | | | |
| Chem control | Level I | no calibration on auto analyzer | MEP, SMTP, All measurements are made by calibrated instruments. |
| Temp/Humidity | | 72.3 F./51% RH | MEP, SMTP, temperature and humidity are controlled within limits and recorded. |
| Housekeeping | Level I | 1. Walkoff mat needs frequent changing. Mat in use was so dirty that no dust was removed from shoes. | MEP, SMTP, Walk off mat needs to be checked regularly and replaced when no longer "sticky." |
| | Level II | 2. Dust and resist flakes were noticed on shelf under printing table | MEP, SMTP all items are in proper storage or in use. No trash or discarded items on floor. |
| | Level I | 3. No calibration on thermal roller controls on resist laminator | MEP, SMTP all measurements are made by calibrated instruments. |
| Traveler Update | | | MEP, SMTP, travelers are updated. |
| Lamination | | | |
| Work Instructions Available | | OK | MEP, SMTP, work instructions are available |
| Equipment Maint Log | | See above | MEP, SMTP, maintenance log is available. |
| PM | | | MEP, SMTP, PM is done according to plan. |
| Calibrate | Level I | No calibration of refrigerated storage | MEP, SMTP, temperature of all storage units is controlled and calibrated. |
| | | All Presses within calibration | MEP, SMTP, all presses are calibrated. |
| Safety Practices | | | |
| MSDS Available | Level IV | See above | STYP, MSDS need to be located in each section, especially where chemicals are stored and used. MSDS gives instructions on exposure treatment, spill containment, etc. |

TABLE 1-continued

| Audit Checklist | Recommendation Level | Recommendation/ Comments | |
|---|---|---|---|
| Tool | | | |
| Control | | Excellent | |
| Use control | | Excellent | |
| Setup | | | |
| Book method | | Very well organized and layed out | |
| Material Pull | | Excellent | |
| Matl Storage | | Neatly stored | |
| Release sheet re-use | | good work habit | |
| CoC verified | | OK - all preg stored in refrigerator was marked with expiration date and lot number. | MEP, SMTP, CoC is verified. |
| Temp/Humidity | Level I | Temp and humidity chart recorder present but not in use. | MEP, SMTP, temp and humidity controlled to within limits and recorded. |
| Handling | | Good | |
| Housekeeping | Level I | 1. Walkoff mat needs frequent changing. Mat in use was so dirty that no dust was removed from shoes. Suggest the addition of a walkoff rug. | MEP, SMTP, Walk off mat needs to be checked regularly and replaced when no longer "sticky." |
| Traveler Update | | OK | MEP, SMTP, travelers are updated. |
| Inspection | | | |
| Work Instructions Available | Level I | No, Class 3 will necessitate work instruction update to reflect additional process inspections and tests. | MEP, SMTP, work instructions are available. |
| Tools Available | | | |
| Pins | Level II | In Final/Incoming - pins are stored safely in a file drawer and pin organizer. However, pin gauges are not checked prior to use. Recommend using a micrometer to check each pin before use. | MEP, SMTP, pins are properly stored according to size. |
| Mics | | In Calibration | MEP, SMTP, Mics are within calibration |
| Calip | | In Calibration | MEP, SMTP, calipers are within calibration. |
| Loupe | | N/A | |
| Scale | | OK | MEP, SMTP, scale is within calibration |
| Magnification | Level I | 3–4 Diopter ring lamps in use. | Spec 6018A requires 7 to 30X |
| Other | | N/A | |
| Thickness Measurements | | | |
| Method | | XRF | |
| Equipment Calibrated | | XRF sources are used for calibration and were within calibration. | MEP, SMTP, XRF sources are within calibration |
| | Level I | Must remove expired calibration sticker from XRF machine. | MEP, SMTP, equipment calibration is current. |
| Used for | | PbSn thickness measurements | |
| Verification | | | |
| Dimensional | | | |
| hole size | | pinned | MEP, SMTP, dimensions measured with calibrated instruments. |
| overall | | micrometers, calipers | MEP, SMTP, dimensions measured with calibrated instruments |
| thickness | | XRF | MEP, SMTP, dimensions measured with calibrated instruments |

TABLE 1-continued

| Audit Checklist | Recommendation Level | Recommendation/ Comments | |
|---|---|---|---|
| circuit line | | coordinate measuring machine | MEP, SMTP, dimensions measured with calibrated instruments |
| circuit space | | same | MEP, SMTP, dimensions measured with calibrated instruments |
| edge | | visual | |
| all critical dim verified | Level II | inspection observed in Final did not check all critical dimensions noted on the dwg. Operator said engineering did not require the dimension to be measured - dwg was not updated (magnet) | IPC-6018A-3.5, |
| warp & twist | Level III | No warp and twist measurements made | IPC-6018A-3.5.4 |
| final features | | visual | |
| Cu thickness | Level I | CoC from Outside Vendor used, no referee measurements made | MEP, SMTP, Referee measurements are used to confirm certificates of compliance. |
| front-to-back | | coordinate measuring machine | MEP, SMTP, dimensions measured with calibrated instruments |
| other | | | |
| Surface Finish | | | |
| thickness verification | Level I | At final only. Should be checked in CP, referee measurements should be made on all OV parts | MEP Thickness checked in CP. |
| surface | | OK | |
| hole | Level I | No Cu thickness measurements made at microsection - req by 6018A | IPC-6018A- 3.5, 3.5.1–3.5.3 |
| visual | | Colored tape notes defects on dwg and starts an NCMR (non conforming material review). Some defects are passed on to the next operation and then reviewed on return. NCMR is voided if parts comply. This is a good systems with adequate checks and balances | MEP, SMTP, defects on dwg noted. NCMR initiated. |
| plating adhesion test | | OK | MEP, SMTP, dimensions measured with calibrated instruments |
| method | | Std. tape test | |
| Physical Tests of Final Products | | | |
| Microsection - note: all requirements can be waived by customer. Must have documentation on file. | Level I | To conform to 6018A these tests must be performed in accordance with the appropriate specification unless otherwise specified by your customer. If customer waives testing, ITM suggests occasional referee testing. | IPC-6018A-3.5.2, 3.7, 3.7.2 IPC-TM-650-2.0, et al. |
| coupon taken | | | |
| solderability | Level I | J-Std-003 - this is an important test. The results can indicate a problem in CP, with cleanliness and with your Outside Vendor | Ref. IPC-TM-650 |
| solder float | Level I | Thermal shock required (6018A-3.12) | IPC-TM-650, 2.6.7.2 |
| thermal stress per | Level I | Thermal stress required (6018A-3.12) | IPC-TM-650, 2.6.8 |
| lap shear | Level I | Required (6018A-3.7.2.17) | IPC 6018A-3.7.2.17 |
| cleanliness | | One of the cleanest and best organized departments audited | MEP, SMTP, all items in proper storage or in use. No discarded items on floor. |
| Handling | | OK | |

TABLE 1-continued

| Audit Checklist | Recommendation Level | Recommendation/ Comments | |
|---|---|---|---|
| Housekeeping | | Excellent | MEP, SMTP, all items in proper storage or in use. No discarded items on floor. |
| Traveler Update | | N/A | |
| Test | | | |
| Work Instructions Available | | All electrical testing is subcontracted | |
| Test Method | Level I | These and other test are required by 6018A, unless otherwise specified by the customer. | IPC 6018A |
| Surface Insulation Resistance Coupon Board | Level I | Required | IPC-TM-650, 2.6.3 (ref Table 3-16 in 6018A) |
| Moisture Insulation Resistance Coupon Board | Level I | Required | IPC-TM-650, 2.6.3 (ref Table 3-16 in 6018A) |
| TDR Coupon Board | Level I | Required | IPC-TM-650, 2.5.5.7 |
| Open/short | Level I | Required | IPC-6018, 3.10.3 |
| Handling | | N/A | |
| Housekeeping | | N/A | |
| Traveler Update | | N/A | |
| Shipping | | | |
| CoC included | | With all jobs, plus a copy of the purchase order | MEP, SMTP, CoC included in all jobs. |
| Desiccant | | if required | MEP, SMTP, desiccant included in package if required by product. |
| Single/stacked | | OK | |
| Clean/dry | | OK | |
| Handling | | OK | |
| Housekeeping | Level IV | Head hazard under stairs. S/B marked with black/yellow striped tape foam. | OSHA (NY-OSHA) (NY-OSHA (NY-OSHA)) |
| Traveler Update | | OK | MEP, SMTP, all travelers are updated. |

The results of the process audit were presented to the personnel of Company E. The manufacturing facility of Company E was re-audited within one month of the initial audit. All Level I and Level IV recommendations were implemented by the second audit and no other items had deteriorated. The certification entity issued a certification to the product specifications, process standards and safety standards for the manufacturing facility.

The certification is valid for 1.5 years and could be renewed with a follow-up process audit. The certification entity has made itself available to Company E's current and future clients to discuss and verify the certification. The certification entity also transmitted an electronic copy of the certification to Company E. Company E posted said certification on their web site. The certification entity granted the right to use its logo to Company E for the purpose of authenticating the certification to third parties. The paper copy of the certification was personally signed by the managing member of the certification entity and sent to Company E. The paper copy also contained identification of Company E, their location, identification of the certification entity, their logo, an issue date, and expiration date and a statement of the standards and specifications to which the certification pertained. The electronic copy of the certification contained the same elements.

Having thus described the invention with particular reference to the embodiments thereof, it will be obvious that various changes and modifications can be made therein without departing from the spirit and scope of the present invention as defined in the appended claims.

What I claim is:

1. A method for certifying that a first manufacturing facility is capable of producing quality printed circuit boards or printed circuit board assemblies of a first particular type, said method comprising the steps of:

performing an inspection of at least one second manufacturing facility, wherein said at least one second manufacturing facility is known to produce quality printed circuit boards or printed circuit board assemblies of said first particular type;

preparing a first manufacturing process setup standard based on said inspection;

performing an audit of said first manufacturing facility against said first manufacturing process setup standard; and issuing a process certification to said first manufacturing facility if said first manufacturing facility passes said audit; wherein said printed circuits or printed circuit assemblies are also of a second particular type and wherein said method further comprises the additional steps of:

performing a second inspection of at least one third manufacturing facility known to produce good printed circuits or printed circuit assemblies of said second particular type;

preparing a second manufacturing process setup standard based on said second inspection of said at least one third manufacturing facility;

performing a second audit on said first manufacturing facility against said second manufacturing process setup standard; and issuing a second certification to said first manufacturing facility if said first manufacturing facility passes said second audit; and wherein;

said first particular type is through-hole printed circuit boards;

said second particular type is surface mount printed circuit boards; and at least one of said inspections or audits is carried out at least in part using a temperature measuring device.

2. The method of claim 1 wherein said first manufacturing process setup standard comprises elements, said audit comprises items, each of said items corresponds to at least one of said elements, and wherein said method further comprises the steps of:

making type I recommendations if an item of said audit does not satisfy a corresponding element of said first manufacturing process setup standard;

performing a follow-up audit of said first manufacturing facility to determine if all of said type I recommendations have been implemented; and issuing a process certification if said follow-up audit confirms that all of said type I recommendations have been implemented.

3. The method of claim 1 wherein said audit is performed within one year of said inspection of said second manufacturing facility known to produce good printed circuits or printed circuit assemblies.

4. The method of claim 1 wherein said printed circuits or printed circuit assemblies belong to a given class of printed circuits or printed circuit assemblies that have a corresponding performance specification and wherein said method comprises the additional steps of:

performing a performance audit of said printed circuits or printed circuit assemblies against said performance specification; and issuing a product certification if said printed circuits or printed circuit assemblies pass said performance audit.

5. The method of claim 1 wherein said at least one second manufacturing facility known to produce said good printed circuits or printed circuit assemblies comprises three manufacturing facilities known to produce said good printed circuits or printed circuit assemblies.

6. The method of claim 1 wherein said first manufacturing process setup standard comprises the specification of one or more of:

acceptable equipment;

acceptable materials;

ambient temperature;

ambient humidity;

line speed parameters;

operator attitudes; or plant layout.

* * * * *